United States Patent
Chang

(10) Patent No.: US 8,236,602 B2
(45) Date of Patent: Aug. 7, 2012

(54) PHASE CHANGE MEMORY DEVICE RESISTANT TO STACK PATTERN COLLAPSE AND A METHOD FOR MANUFACTURING THE SAME

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 127 days.

(21) Appl. No.: 12/782,235

(22) Filed: May 18, 2010

(65) Prior Publication Data
US 2010/0227440 A1 Sep. 9, 2010

Related U.S. Application Data

(62) Division of application No. 12/174,287, filed on Jul. 16, 2008, now Pat. No. 7,884,344.

(30) Foreign Application Priority Data

Apr. 28, 2008 (KR) .................. 10-2008-0039512

(51) Int. Cl.
*H01L 21/00* (2006.01)
(52) U.S. Cl. ............. 438/95; 438/96; 438/97; 438/98; 438/212; 257/2; 257/4; 257/328; 257/329; 257/341; 257/342; 257/528; 257/529; 257/E31.001; 257/E31.002; 257/E45.002; 365/148
(58) Field of Classification Search .......... 438/95, 438/96, 97, 212; 257/2, 4, 328, 329, 341, 257/342, 528, 529, E31.031, E31.002, E45.002; 365/148
See application file for complete search history.

(56) References Cited

U.S. PATENT DOCUMENTS

| | | | |
|---|---|---|---|
| 2008/0011997 A1* | 1/2008 | Moniwa et al. | 257/2 |
| 2009/0065758 A1* | 3/2009 | Chao | 257/4 |
| 2009/0302299 A1 | 12/2009 | Chang | |

FOREIGN PATENT DOCUMENTS

| KR | 100790449 B1 | | 12/2007 |
|---|---|---|---|
| KR | 100791008 B1 | | 12/2007 |
| KR | 10-2008-0006487 | * | 1/2008 |
| KR | 1020080006487 A | | 1/2008 |
| KR | 1020080044523 A | | 5/2008 |

OTHER PUBLICATIONS

USPTO OA mailed Oct. 14, 2009 for Parent U.S. Appl. No. 12/174,287.
USPTO OA mailed Jun. 3, 2010 for Parent U.S. Appl. No. 12/174,287.

* cited by examiner

*Primary Examiner* — A. Sefer
*Assistant Examiner* — Farid Khan
(74) *Attorney, Agent, or Firm* — Ladas & Parry LLP

(57) ABSTRACT

A phase change memory device resistant to stack pattern collapse is presented. The phase change memory device includes a silicon substrate, switching elements, heaters, stack patterns, bit lines and word lines. The silicon substrate has a plurality of active areas. The switching elements are connected to the active areas. The heaters are connected to the switching elements. The stack patterns are connected to the heaters. The bit lines are connected to the stack patterns. The word lines are connected to the active areas of the silicon substrate.

22 Claims, 16 Drawing Sheets

PHASE CHANGE MEMORY DEVICE RESISTANT TO STACK PATTERN COLLAPSE AND A METHOD FOR MANUFACTURING THE SAME

CROSS-REFERENCE TO RELATED APPLICATIONS

The present application claims priority to Korean patent application number 10-2008-0039512 filed on Apr. 28, 2008, which is incorporated herein by reference in its entirety.

BACKGROUND OF THE INVENTION

The present invention relates to a phase change memory device and a method for manufacturing the same, and more particularly, to a phase change memory device which can prevent the collapse of the stack patterns of a phase change layer and top electrodes and a method for manufacturing the same.

Memory devices are generally divided into volatile RAMs (random access memory) that lose inputted information when power is interrupted and non-volatile ROMs (read-only memory) that can maintain the stored state of inputted information even when power is interrupted. Some well known volatile RAMs include DRAMs (dynamic RAM) and SRAMs (static RAM). A well known non-volatile ROM includes a flash memory device such as an EEPROM (electrically erasable and programmable ROM).

Although DRAMs are excellent memory devices, DRAMs require a relatively high charge storing capacity. Since the surface area of an electrode of a DRAM must be increased, it is difficult to accomplish a high level of integration for DRAMs. Due to the fact that two gates are stacked on each other for many flash memory devices, high operation voltages are needed as compared to a power supply voltage. According, a separate booster circuit is often needed for flash memory devices in order to generate the necessary voltages required to perform write and delete operations. Further, high level of integration of flash memory devices is also difficult to accomplish.

Much interest has been made in an effort to develop a novel memory device that exhibit simple configurations and that can more easily achieve a high level of integration while retaining the many of the desirable characteristics of non-volatile memory devices. Phase change memory devices promise to realize many of these desirable features.

In the phase change memory device function on the basis of the fact that a phase change can occur in a phase change layer interposed between a bottom electrode and a top electrode. This phase change is associated with a reversible transformation between a crystalline state and an amorphous state brought about by a current flow between the bottom electrode and the top electrode. Accordingly information can be stored in a memory cell of a phase change memory device by measuring the resistances because the specific resistances between the crystalline state and the amorphous state are different.

Phase change memory device often incorporate a chalcogenide layer composed of such material such as germanium (Ge), stibium (Sb), sulfur (S), selenium (Se) and tellurium (Te) is employed as a phase change layer. As a current is applied, the phase change layer undergoes a phase change transistion induced by heat, that is, Joule heat, between the amorphous state and the crystalline state.

Accordingly, in the phase change memory device, the specific resistance of the phase change layer in the amorphous state is often times higher than the specific resistance of the phase change layer in the crystalline state. In a read mode, by sensing the current flowing through the phase change layer, it can be determined whether or not the information stored in a phase change cell has a logic value corresponding to a '1' or a '0'.

Conventional phase change memory device are realized by sequentially depositing a phase change material layer and a top electrode material layer on a bottom electrode and then etching the top electrode material layer and the phase change material layer so that top electrodes and a phase change layer are formed. The stack patterns of the phase change layer and the top electrodes have a vertical linear shape.

In the conventional phase change memory devices, the stack patterns of the phase change layer and the top electrodes are formed having a length that extends from a sense amplifier over about one thousand cells. In the convention phase change memory devices, when the stack patterns are patterned to have a vertical line width below 150 nm, a problem can arise that causes the stack patterns to be prone to collapsing.

This collapsing problem can be minimized or avoided by patterning the top electrode and the phase change layer on cells that have the shape of a pillar. Nevertheless, in this case, because four regions corresponding to the peripheral surfaces of the phase change layer are left open, the composition of the phase change layer is also likely to change in the open regions, According the programming current distribution may have to be widened, and as a result the sensing margin decreases.

Therefore, in order to improve and increase the reliability and the manufacturing yield of the phase change memory device, it is necessary to reduce the etch loss of the phase change layer and prevent the collapse of the stack pattern.

SUMMARY OF THE INVENTION

Embodiments of the present invention are directed to a phase change memory device which can minimize the occurrence or prevent the collapse of the stack patterns of a phase change layer and top electrodes, and a method for manufacturing the same.

Also, embodiments of the present invention are directed to a phase change memory device which can reduce the etch loss of a phase change layer, thereby securing a sensing margin, and a method for manufacturing the same.

Further, embodiments of the present invention are directed to a phase change memory device which can reduce the etch loss of a phase change layer and prevent the collapse of the stack patterns of the phase change layer and top electrodes, thereby improving the reliability thereof and increasing the manufacturing yield, and a method for manufacturing the same.

In one aspect, a phase change memory device comprises stack patterns of a phase change layer and top electrodes, formed over a silicon substrate; and bit lines formed over the stack patterns to be connected with the stack patterns, wherein each of the stack patterns of the phase change layer and the top electrodes have a length that only extends over two memory cells in a parallel direction to that of the bit lines.

The stack patterns can be located in a zigzag pattern along a direction perpendicular to the direction of the bit lines.

The phase change memory device further comprises first top electrode contacts, wiring patterns and second top electrode contacts interposed between the stack patterns and the bit lines.

The first top electrode contacts can be located on center portions of the stack patterns with respect to the direction of the bit lines.

The wiring patterns are connected to the stack patterns by way of the first top electrode contacts in the structure of a chain.

The second top electrode contacts can be located on center portions of the wiring patterns with respect to the direction of the bit lines.

The first top electrode contacts can be located on both sides of the stack patterns so that the first top electrode contacts are provided for respective cells.

The wiring patterns are located over the stack patterns.

In another aspect, a phase change memory device comprises a silicon substrate having a plurality of active regions in that the active regions extend along a first direction and are arranged at substantially regular intervals along a second direction in which the second direction is substantially perpendicular to the first direction; a plurality of switching elements formed in the active regions of the silicon substrate; a plurality of heaters formed on the respective switching elements; a plurality of stack patterns formed on the heaters, in which each stack pattern comprises a phase change layer and top electrodes, each stack pattern having a length that extends over two cells in the second direction and come into contact with the two cells; first top electrode contacts formed on the stack patterns; a plurality of wiring patterns formed on the first top electrode contacts in the second direction; a plurality of second top electrode contacts formed on the wiring patterns; a plurality of bit lines formed on the second top electrode contacts so that the bit lines are arranged in the second direction; and a plurality of word lines formed over the bit lines so that the word lines extend along the first direction perpendicular to the bit lines and so that the word lines are connected with the silicon substrate.

The switching elements comprise vertical PN diodes.

The phase change memory device further comprises an N+ base layer formed in surfaces of the active regions of the silicon to substrate.

The stack patterns are located in a zigzag pattern along the first direction.

The stack patterns may have a width of 10~200 nm in the first direction and a length of 50~500 nm in the second direction.

The stack patterns may have a separation distance of 20~200 nm in the first direction and a separation distance of 20~200 nm in the second direction.

The first top electrode contacts may be located on center portions of the stack patterns with respect to the second direction.

The first top electrode contacts may have a size of 20~200 nm in each of the first direction and the second direction.

The first top electrode contacts may have sizes that are different in the first direction and the second direction.

The first top electrode contacts may have a gap of 0~100 nm between an edge of the top electrode and an edge of each first top electrode contact.

The wiring patterns are connected with the stack patterns by way of the first top electrode contacts in the structure of a chain.

The wiring patterns may have a width of 20~200 nm in the first direction and a length of 50~1,000 nm in the second direction.

The wiring patterns may have a separation distance of 10~100 nm in the first direction.

The second top electrode contacts may be located on center portions of the wiring patterns in the second direction.

The second top electrode contacts may have a size of 20~200 nm in each of the first direction and the second direction.

The second top electrode contacts may have sizes that are different in the first direction and the second direction.

The bit lines may have a width of 20~200 nm.

The method for manufacturing a phase change memory device comprises the steps of forming a plurality of stack patterns on a silicon substrate, in which each stack pattern comprises a phase change layer and a top electrode; and forming a plurality of bit lines over the stack patterns to be connected to the stack patterns, wherein each stack pattern has a length that only extends over two cells in a direction parallel to that of the bit lines.

The stack patterns may be formed and located in a zigzag pattern along a direction substantially perpendicular to the direction of the bit lines.

The method may further comprises the step of forming a stack of first top electrode contacts, wiring patterns and second top electrode contacts between the stack patterns and the bit lines.

The first top electrode contacts may be formed to be located on center portions of the stack patterns with respect to the direction of the bit lines.

The wiring patterns may be formed to be connected with the stack patterns by way of the first top electrode contacts in the structure of a chain.

The second top electrode contacts may be formed to be located on center portions of the wiring patterns with respect to the direction of the bit lines.

The first top electrode contacts may be formed to be located on both sides of the stack patterns such that the first top electrode contacts are provided for respective cells.

The wiring patterns may be formed to be located over the stack patterns.

The method for manufacturing a phase change memory device comprises the steps of preparing a silicon substrate having a plurality of active regions in which the active regions extend along a first direction and are arranged at substantially regular intervals along a second direction, in which the second direction is substantially perpendicular to the first direction; forming a plurality of switching elements in the active regions of the silicon substrate; forming a plurality of heaters on the respective switching elements; forming a plurality of stack patterns on the heaters, wherein each stack pattern comprises a phase change layer and a top electrode, each stack pattern has a length that only extends over two cells along the second direction and comes into operational contact with the heaters of two underlying memory cells; forming a plurality of first top electrode contacts on the stack patterns; forming a plurality of wiring patterns on the first top electrode contacts, wherein each wiring pattern contacts with two first top electrode contacts; forming a plurality of second top electrode contacts on the wiring patterns; forming a plurality of bit lines connected with the second top electrode contacts, wherein the bit lines are arranged along the second direction; and forming a plurality of word lines over the bit lines such that the word lines extend along the first direction so that the word lines are substantially perpendicular to the bit lines and wherein the word lines are connected to the silicon substrate.

The switching elements may be vertical PN diodes.

Before the step of forming the vertical PN diodes, the method may further comprises the step of forming a plurality of N+ base layers in surfaces of the active regions of the silicon substrate.

The stack patterns may be formed to be located in a zigzag pattern along the first direction.

The stack patterns may be formed to have a width of 10~200 nm in the first direction and a length of 50~500 nm in the second direction.

The stack patterns may be formed to have a separation distance of 20~200 nm in the first direction and a separation distance of 20~200 nm in the second direction.

The first top electrode contacts may be formed to be located on center portions of the stack patterns when viewed in the second direction.

The first top electrode contacts may be formed to have a size of 20~200 nm in each of the first direction and the second direction.

The first top electrode contacts may be formed to have sizes that are different in the first direction and the second direction.

The first top electrode contacts may be formed to have a gap of 0~100 nm measured between an edge of the top electrode and an edge of each first top electrode contact.

The wiring patterns may be formed to be connected with the stack patterns by way of the first top electrode contacts in the structure of a chain.

The wiring patterns may be formed to have a width of 20~200 nm in the first direction and a length of 50~1,000 nm in the second direction.

The wiring patterns may be formed to have a separation distance of 10~100 nm in the first direction.

The second top electrode contacts may be formed to be located on center portions of the wiring patterns in the second direction.

The second top electrode contacts may be formed to have a size of 20~200 nm in each of the first direction and the second direction.

The second top electrode contacts may be formed to have sizes that are different in the first direction and the second direction.

The bit lines may be formed to have a width of 20~200 nm.

DESCRIPTION OF SPECIFIC EMBODIMENTS

Stack patterns of a phase change layer and top electrodes that are formed along a vertical line exhibit a tendency to collapse. The present invention provides a way of fabricating the stack to patterns that are substantially less prone to collapsing. Further the present invention provides the additional benefit that the etch loss of the phase change layer can be substantially reduced. Yet further, the present invention provides for a shortening of the length of the stack patterns of the phase change layer and the top electrodes such that the margin of a subsequent contact process can be secured. Even further the present inention provides a decreased contact depth between top electrodes and bit lines, so that the contact process can be more stably conducted. Accordingly, the present invention provides an enhanced reliability and a concomitant increase in the manufacturing yield of these phase change memory devices.

Hereafter, specific embodiments of the present invention will be described with reference to the attached drawings.

Figure 1:
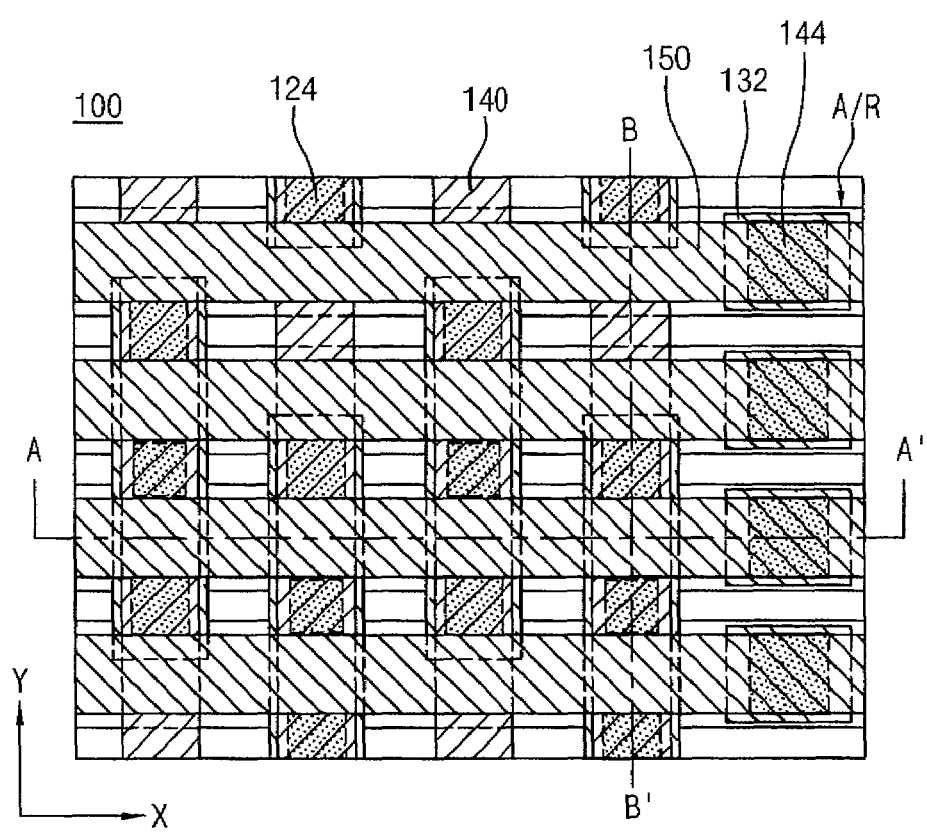
FIG. 1 is a plan view illustrating a phase change memory device in accordance with an embodiment of the present invention.
Figure 2A:
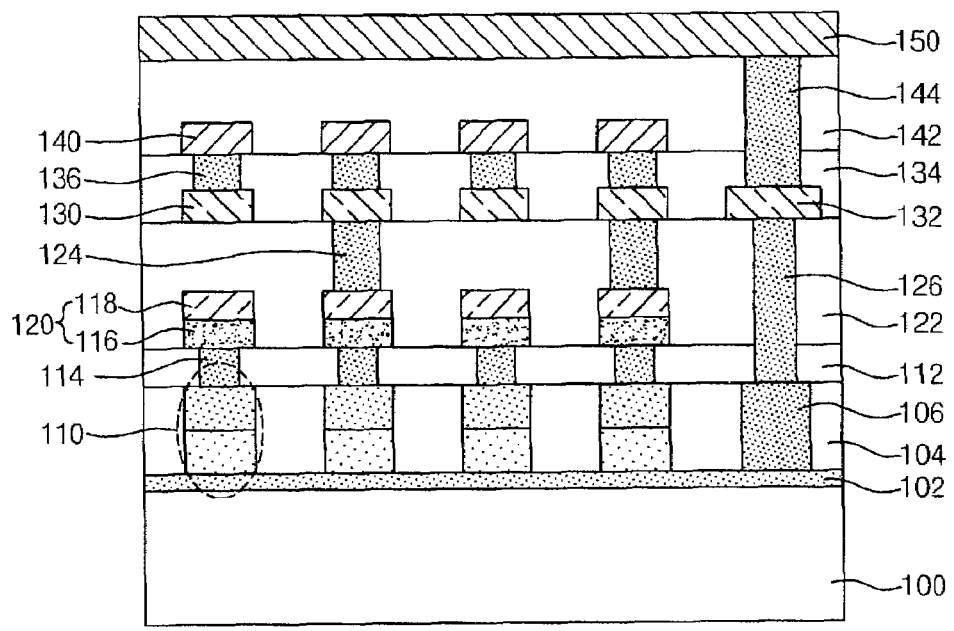
FIGS. 2A and 2B are cross-sectional views taken along the lines A-A' and B-B' of FIG. 1.
Figure 2B:
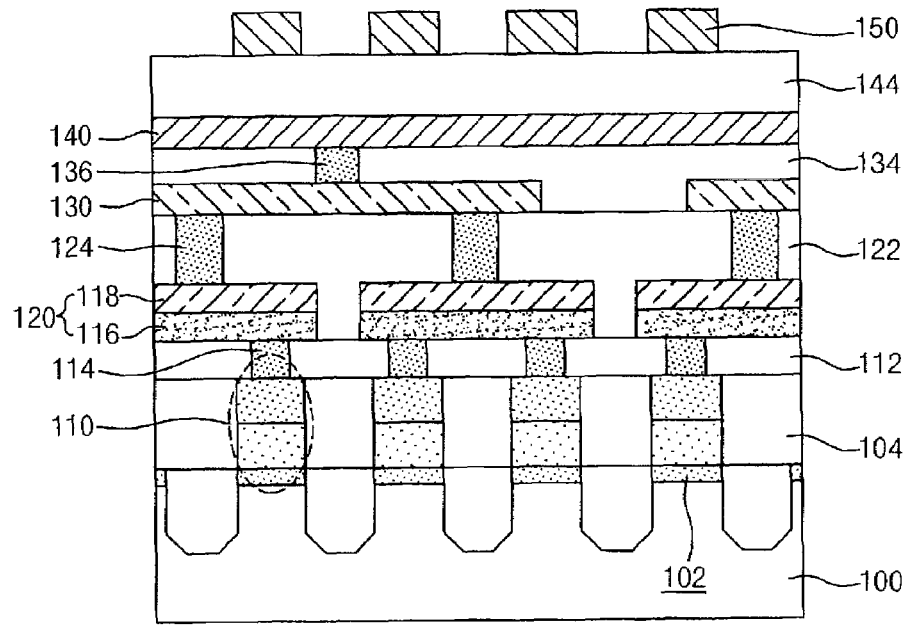

FIG. 1 is a plan view illustrating a phase change memory device in accordance with an embodiment of the present invention, and FIGS. 2A and 2B are cross-sectional views taken along the lines A-A' and B-B' of FIG. 1.

Referring to these drawings, a plurality of active regions A/R are defined in a silicon substrate 100 such that they extend along a first direction X and are arranged at substantially regular intervals along a second direction Y, in which the second direction is substantially perpendicular to the first direction X. An a plurality of N+ base layers 102 is then formed on the surfaces of the active regions A/R. A plurality of vertical PN diodes 110 is then formed on the N+ base layers, in which the PN diodes 110 act as switching elements. Each first contact plug 106 is formed on a corresponding respective N+ base layer 102. It is preferred that one string be constituted by vertical PN diodes 110 which have the number corresponding to a multiple of 2.

The Heaters 114 also serve as bottom electrodes and are formed on the respective vertical PN diodes 110. Each stack patterns 120 comprises a phase change layer 116 and a top electrode 118 that extend along in the second direction Y, that is, each stack pattern extends in parallel to the bit line. According to the present invention, the stack pattern 120 have a short length that only extends over two memory cells of the device. Also, the stack patterns 120 can be formed in a zigzag pattern along in the first direction X, such that they are in parallel to the word lines.

First top electrode contacts 124 are formed on the center portions of the respective stack patterns 120 with respect to the second direction Y. The wiring patterns 130 are formed such that each wiring pattern 130 is connected to two adjoining first top electrode contacts 124 with respect to the second direction Y. Second top electrode contacts 136 are formed on the center portions of the respective wiring patterns 130 with respect to the second direction Y, and bit lines 140 are formed such that each bit line 140 is connected with the second top electrode contacts 136 arranged along the second direction Y. Accordingly, the stack patterns 120 of the phase change layer 116 and the top electrode 118 are connected to the bit lines 140.

The word lines 150 are then formed over the bit lines 140 such that they are connected with the first contact plugs 106 that are formed on the N+ base layer 102 by way of second contact plugs 126, buffer patterns 132 and third contact plugs 144. The word lines 150 are formed to extend along the first direction X which is substantially perpendicular to the bit lines 140. Each word line 150 is arranged at regular intervals along the second direction Y. The second contact plugs 126 are simultaneously formed when forming the first top electrode contacts 124. The buffer patterns 132 are formed along with the wiring patterns 130.

The stack patterns of the phase change layer and the top electrodes are formed to have a short length that extends over only two adjoining memory cells. As a result, collapse of the stack patterns is substantially avoided and prevented.

Since the stack patterns of the phase change layer and the top electrodes have a relatively short length, as compared to those of the conventional art, loss of the peripheral portions of the phase change layer can be substantially avoided and prevented during subsequent etching processes. As a result, changes in the composition of the phase change layer can be substantially avoided and suppressed. As a result, a sensing margin of the phase change memory device of the present invention can be substantially secured.

Because the collapse of the stack patterns and change in the composition of the phase change layer can be substantially prevented, the reliability of the phase change memory device can be substantially improved and the corresponding manufacturing yield can be increased.

In FIGS. 2A and 2B, the reference numeral 104 designates a first insulation layer, the reference numeral 112 designates a second insulation layer, the reference numeral 122 designates a third insulation layer, the reference numeral 134 designates a fourth insulation layer, and the reference numeral 142 designates a fifth insulation layer.

FIGS. 3A through 3H, 4A through 4H, and 5A through 5H are views illustrating the processes of a method for manufacturing a phase change memory device in accordance with another embodiment of the present invention. Here, FIGS. 3A through 3H are plan views, and FIGS. 4A through 4H and 5A through 5H are cross-sectional views taken along the lines A-A' and B-B' of FIGS. 3A through 3H.

Figure 3A:
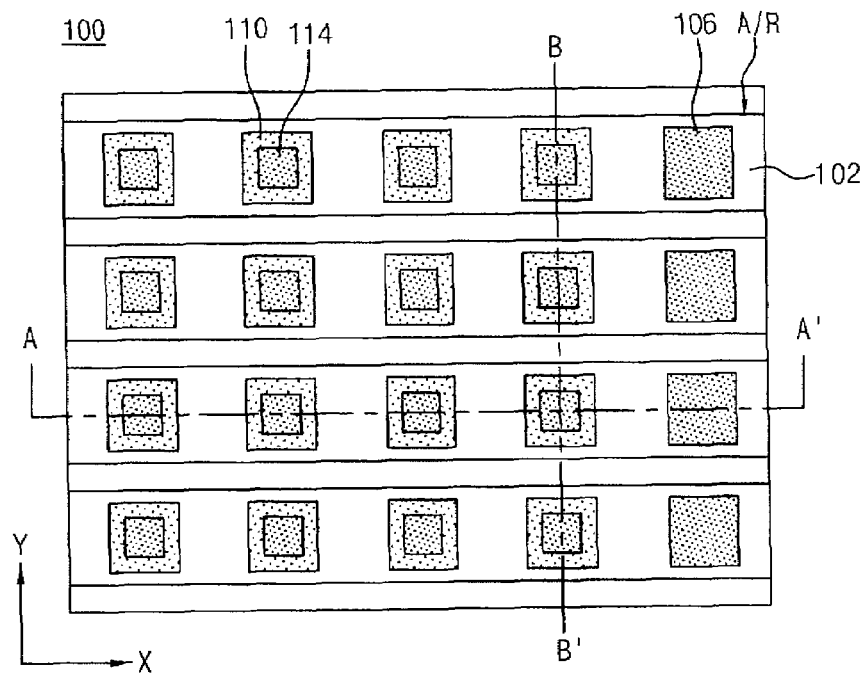
FIGS. 3A through 3H are plan views illustrating the processes of a method for manufacturing a phase change memory device in accordance with another embodiment of the present invention.
Figure 4A:
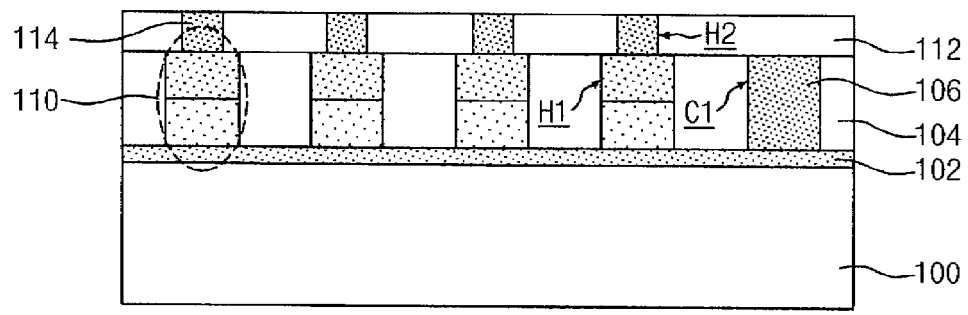
FIGS. 4A through 4H are cross-sectional views taken along the lines A-A' of FIGS. 3A through 3H.
Figure 5A:
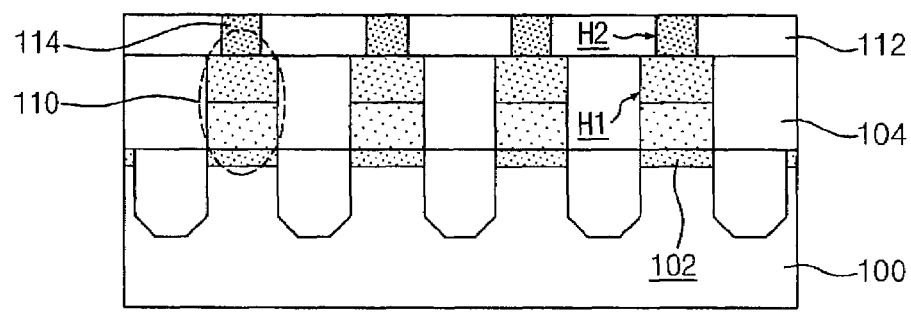
FIGS. 5A through 5H are sectional views taken along the lines B-B' of FIGS. 3A through 3H.

Referring to FIGS. 3A, 4A and 5A, a plurality of active regions A/R are defined in a silicon substrate 100 such that they extend along a first direction X and are arranged in at substantially regular intervals along a second direction Y, in which the second direction Y is substantially perpendicular to the first direction X. A plurality of N+ base layers 102 is formed on the surfaces of the active regions A/R. After forming a first insulation layer 104 on the silicon substrate 100 that includes the N+ base layer 102, first holes H1 are etched into the first insulation layer 104. The first holes H1 are for delimiting switching element forming areas and for defining first contact holes C1 for delimiting areas for forming first contact plugs to be connected with word lines.

By filling a conductive layer in the first holes H1 and in the first contact holes C1, first contact plugs 106 are first formed in the first contact holes C1. By ion-implanting N-type impurities at a low doping concentration into the silicon layer in the lower half portions of the first holes H1 and successively ion-implanting P-type impurities at a high doping concentration into the silicon layer in the upper half portions of the first holes H1, vertical PN diodes 110 serving as switching elements are formed in the first holes H1. These vertical PN diodes 110 are formed such that a predetermined number of vertical PN diodes 110 constitute one string. The first contact plugs 106 are formed on and operative coupled to the N+ base layer 102 between strings. For example, one string can be constituted by vertical PN diodes 110 which have the number corresponding to a multiple of 2.

A second insulation layer 112 is formed on the first insulation layer 104 that has the first contact plugs 106 and the vertical PN diodes 110. After defining second holes H2 by selectively etching the second insulation layer 112, the vertical PN diodes 110 are exposed, and by filling a conductive layer in the second holes H2, a plurality of heaters 114 serving as bottom electrodes are formed.

While not shown in the drawings, before forming the second insulation layer 112, a metal silicide layer can be formed on the upper surfaces of the vertical PN diodes 110.

Figure 3B:
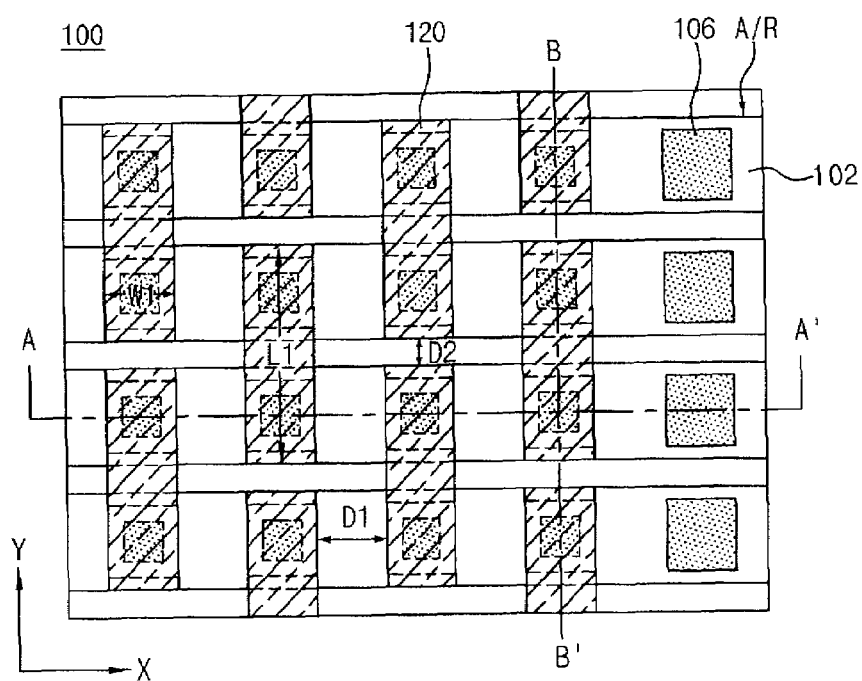
Figure 4B:
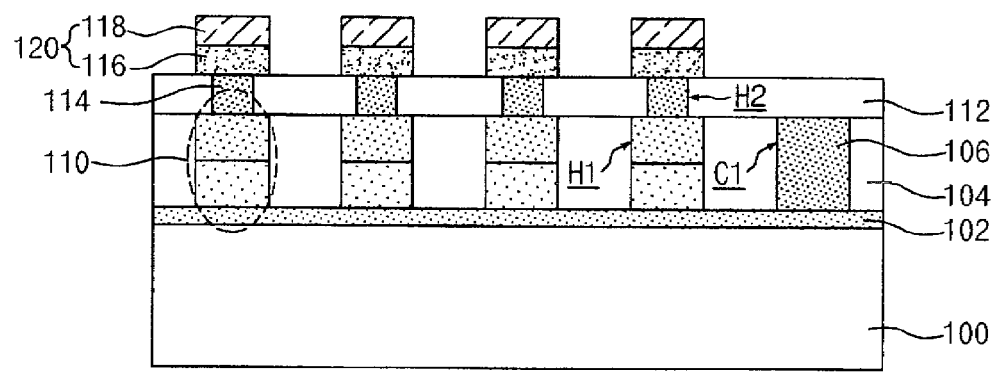
Figure 5B:
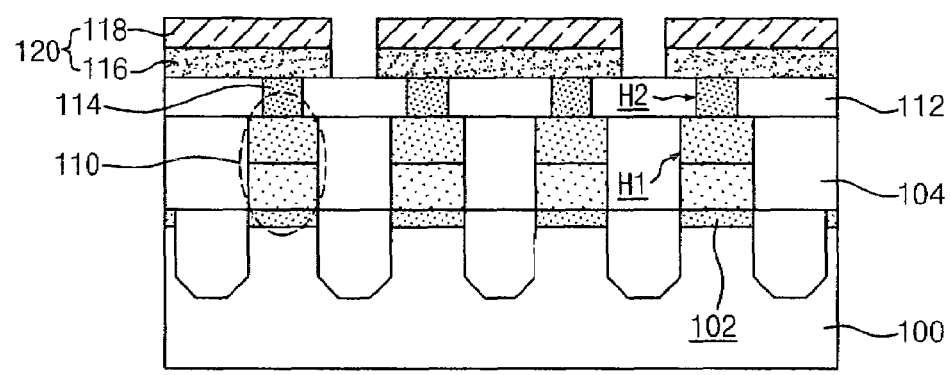

Referring to FIGS. 3B, 4B and 5B, after a phase change material layer and a conductive layer for top electrodes on the second insulation layer 112 that has the heaters 114 is then sequentially deposited. Stack patterns 120 comprising phase change layers 116 and top electrodes 118 are then formed so that they come into contact with the heaters 114. The stack patterns 120 of the phase change layer 116 and the top electrodes 118 are formed so that they have a length that extends over only two cells among the cells arranged in the second direction Y, and are in operational contact with only the heaters 114 of underlying two memory cells. The stack patterns 120 of the phase change layer 116 and the top electrodes 118 may have a width W1 of 10~200 nm along the direction of the word line and may have a length L1 of 50~500 nm along the second direction Y. The stack patterns 120 may have a first separation distance D1 of 20~200 nm along the first direction X and a second separation distance D2 of 20~200 nm along the second direction Y. The separation distances between the stack patterns 120 in the first direction Y and the second direction Y may be different from each other.

In the present invention, the stack patterns 120 of the phase change layer 116 and the top electrodes 118 have a length remarkably shorter than that of the stack patterns as compared to the conventional fabrication arts that often times can extend well over about one thousand cells. Accordingly, in the present invention, defects such as the collapse of the stack patterns 120 are far less likely to occur when conducting a patterning process. Further, in the present invention, the etch loss of the peripheral portions of the phase change layer 116 can be substantially suppressed, whereby making it is possible to substantially prevent the composition of the phase change layer 116 from being substantially changed due to the etch loss.

Figure 3C:
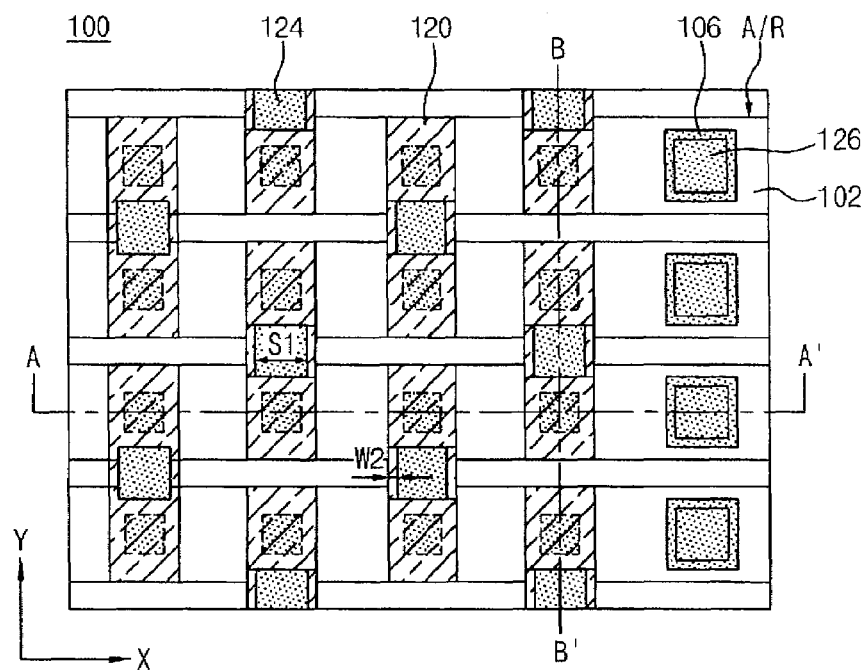
Figure 4C:
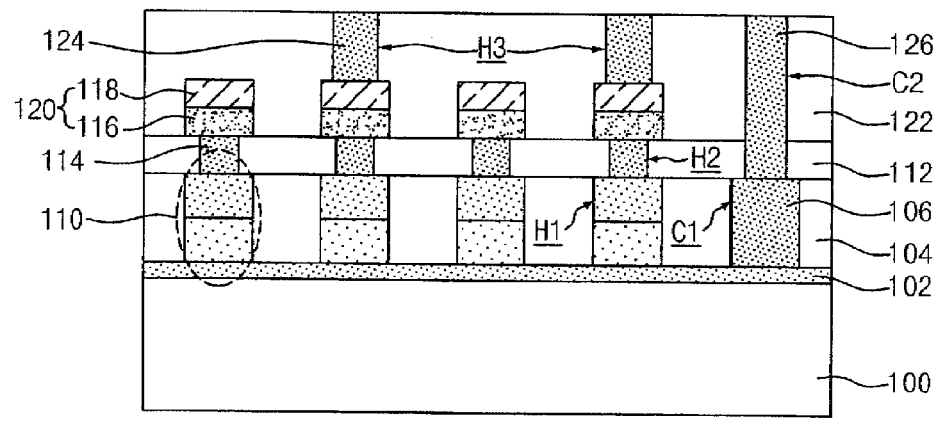
Figure 5C:
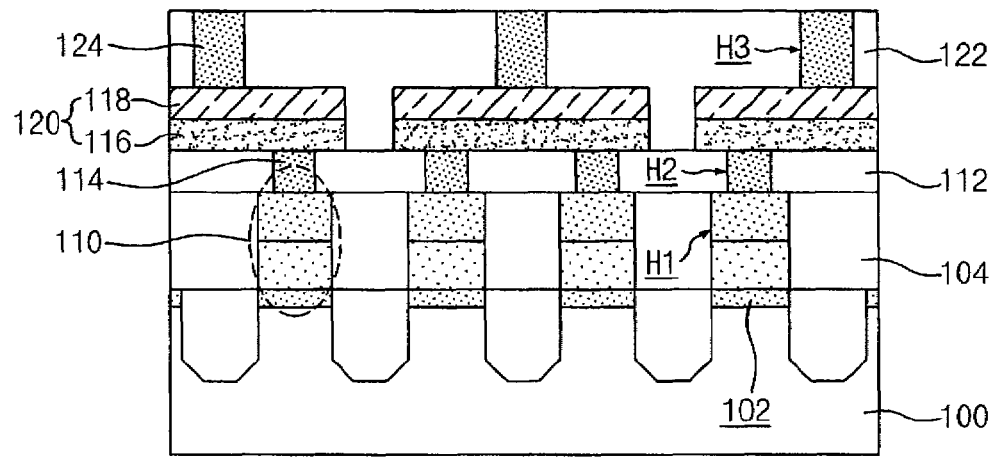

Referring to FIGS. 3C, 4C and 5C, a third insulation layer 122 is formed on the second insulation layer 112 in which the second insulation layer includes the stack patterns 120 of the phase change layer 116 and the top electrodes 118. Selectively etching the third insulation layer 122 and the second insulation layer 112, third holes H3 are defined that expose the center portions of the stack patterns 120 with respect to the second direction Y and second contact holes C2 are defined that expose the first contact plugs 106. The third holes H3 and the second contact holes C2 are then filled with a conductive layer, to form a plurality of first top electrode contacts 124 and a plurality of second contact plugs 126. One preferred configuration is that the first top electrode contacts 124 are formed so that they have a size S1 of 20~200 nm in the first and second directions X and Y and have a W2 of 0~100 nm gap between an edge of the top electrode 118 of each stack pattern 120 and an edge of the respective first top electrode contact 124. Another preferred configuration is that the first top electrode contacts 124 may be formed so that they have different sizes in the first direction X and the second direction Y.

The first top electrode contacts 124 may be formed in a zigzag pattern with respect to the stack patterns 120 of the phase change layer 116 and the top electrodes 118, whereby the margin of a contact process can be increased.

Figure 3D:
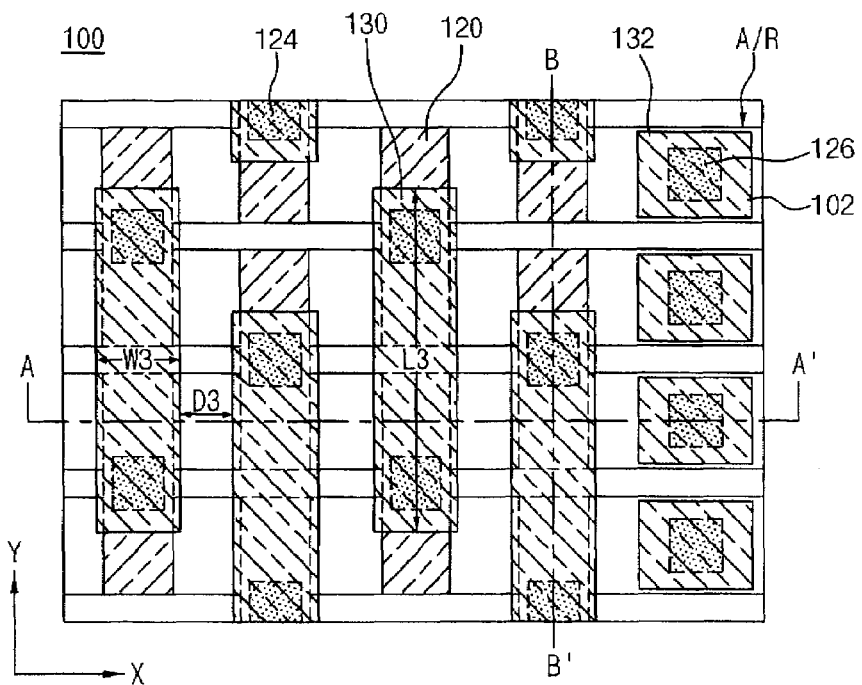
Figure 4D:
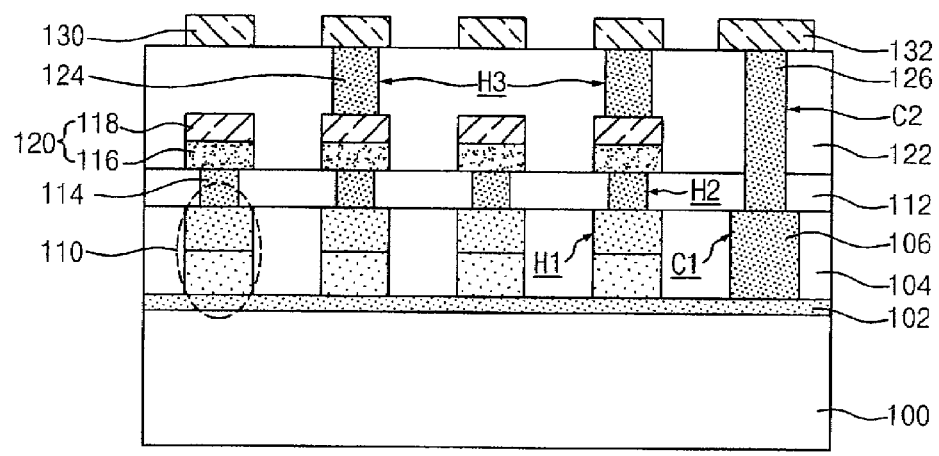
Figure 5D:
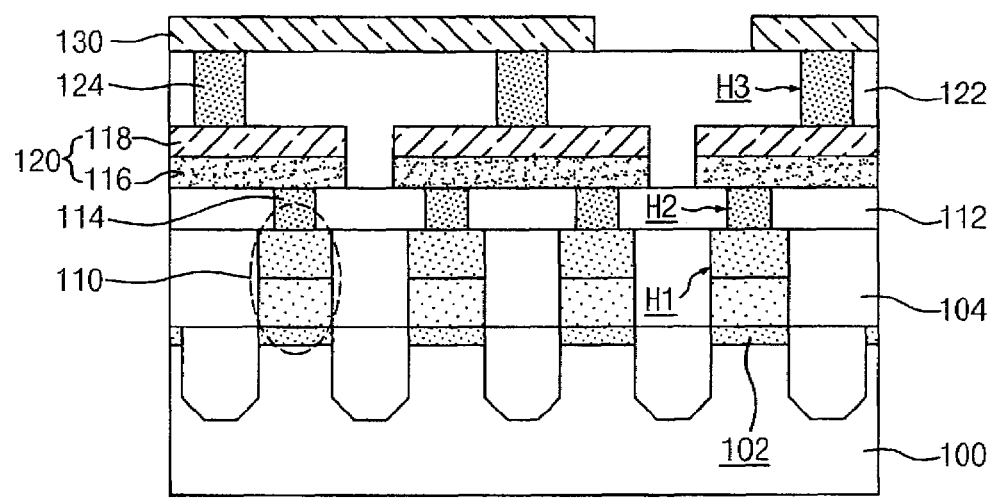

Referring to FIGS. 3D, 4D and 5D, a conductive layer comprising a metallic material is formed on the third insulation layer 122 in which the third insulation layer 122 includes the first top electrode contacts 124 and the second contact plugs 126. By selectively patterning this conductive layer, a plurality of wiring patterns 130 is then formed so that each wiring pattern is in operational contact with two first top electrode contacts 124 adjoining each other along the second direction Y, and buffer patterns 132 are also formed on the second contact plugs 126. The wiring patterns 130 may have a width W3 of 20~200 nm along the first direction X and a length L3 of 50~4,000 nm along the second direction Y. Also, the wiring patterns 130 may have a separation distance D3 of 10~100 nm along the first direction X. The wiring patterns 130 connect the stack patterns 120 of the phase change layer 116 and the top electrodes 118 in the structure of a chain. Preferably, the buffer patterns 132 have the configuration of a pillar and the sectional shape of a rectangle or a square with respect to a top plan view.

Figure 3E:
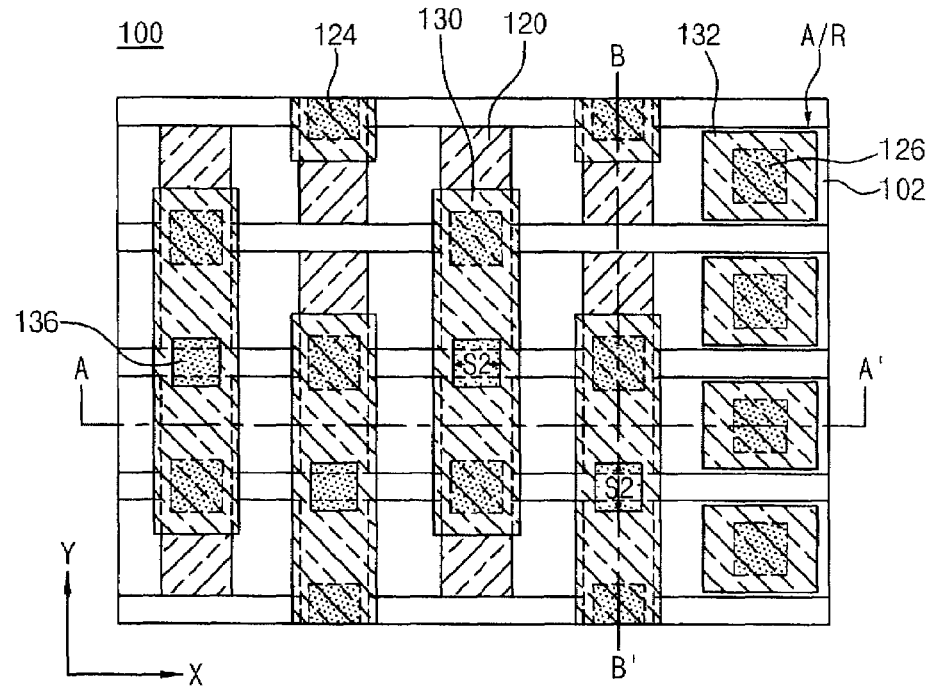
Figure 4E:
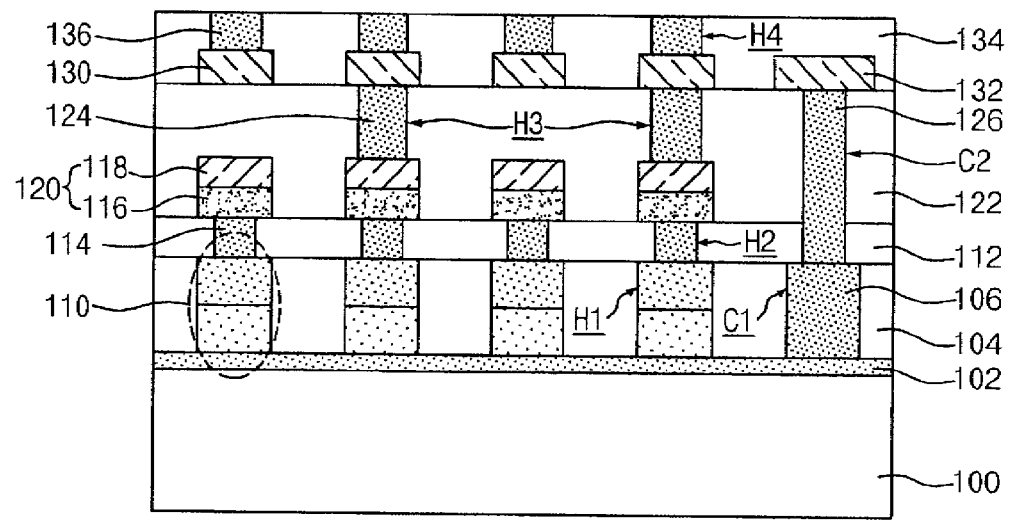
Figure 5E:
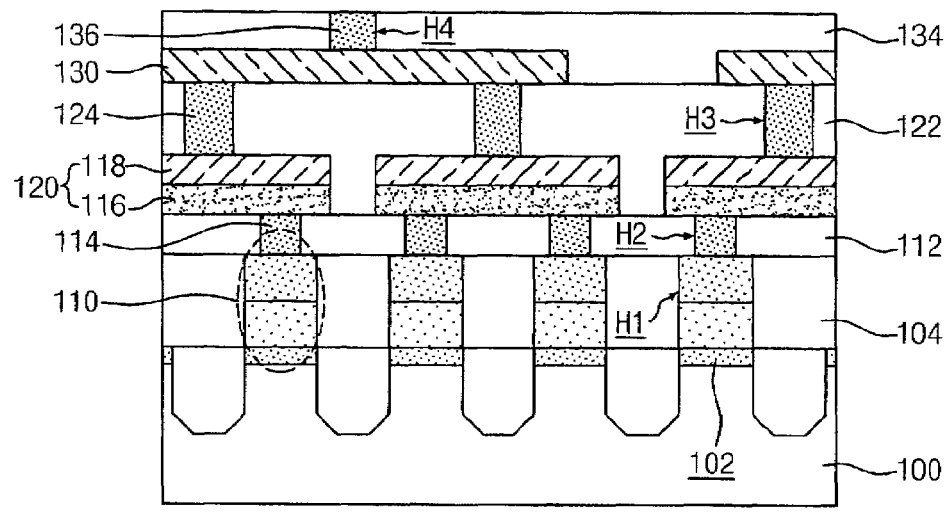

Referring to FIGS. 3E, 4E and 5E, a fourth insulation layer 134 is formed on the third insulation layer 122 which is formed with the wiring patterns 130 and the buffer patterns 132. After defining fourth holes H4 using the selective etching the fourth insulation layer 134. Center portions of the wiring patterns 130 are exposed with respect to the second direction Y. Second top electrode contacts 136 are formed by filling a conductive layer in the fourth holes H4. The second top electrode contacts 136 may have a size S2 of 20~200 nm in both the first direction X and the second direction Y. The second top electrode contacts 136 may be formed such that they have different sizes in the first direction X and the second direction Y.

Figure 3F:
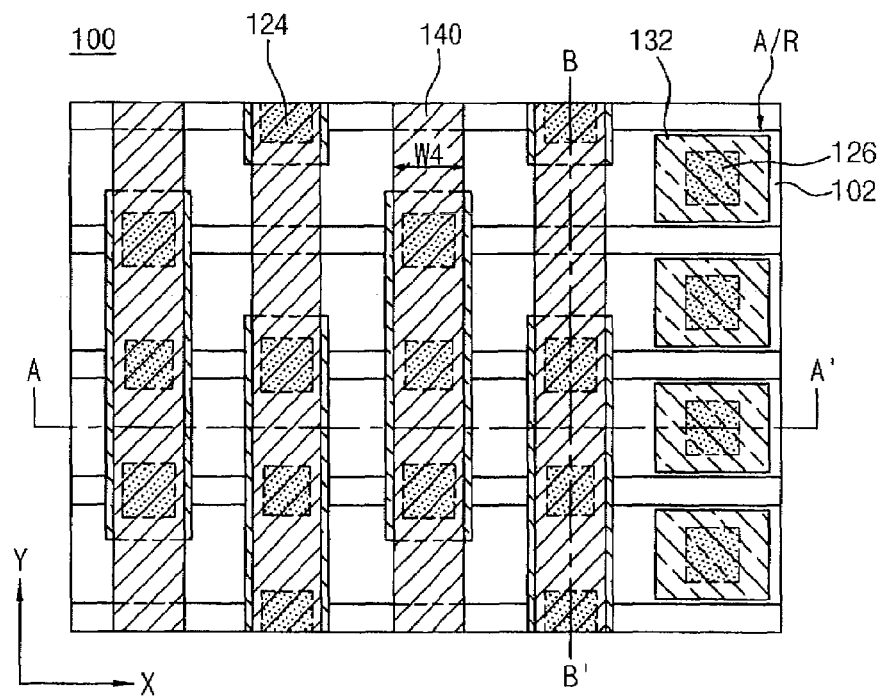
Figure 4F:
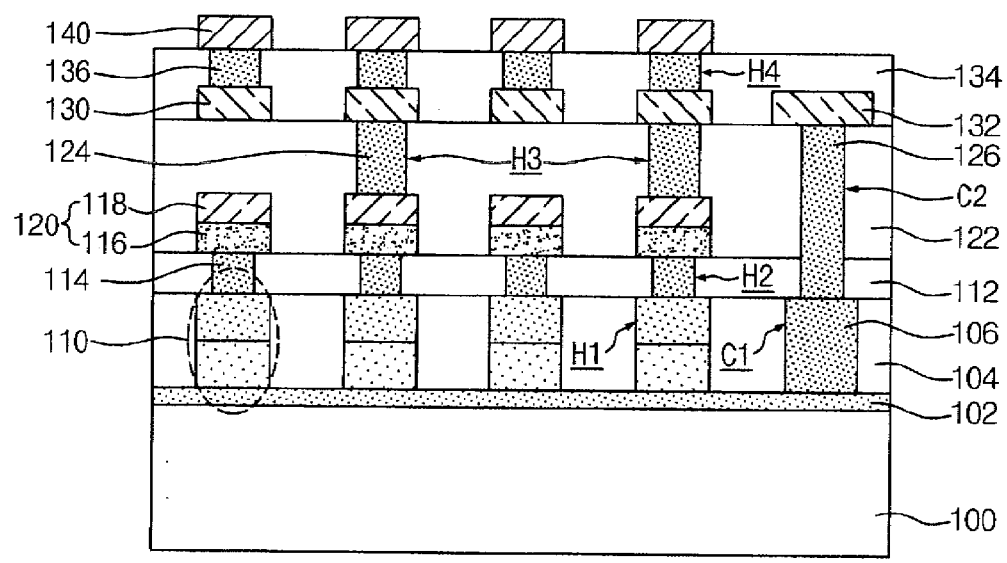
Figure 5F:
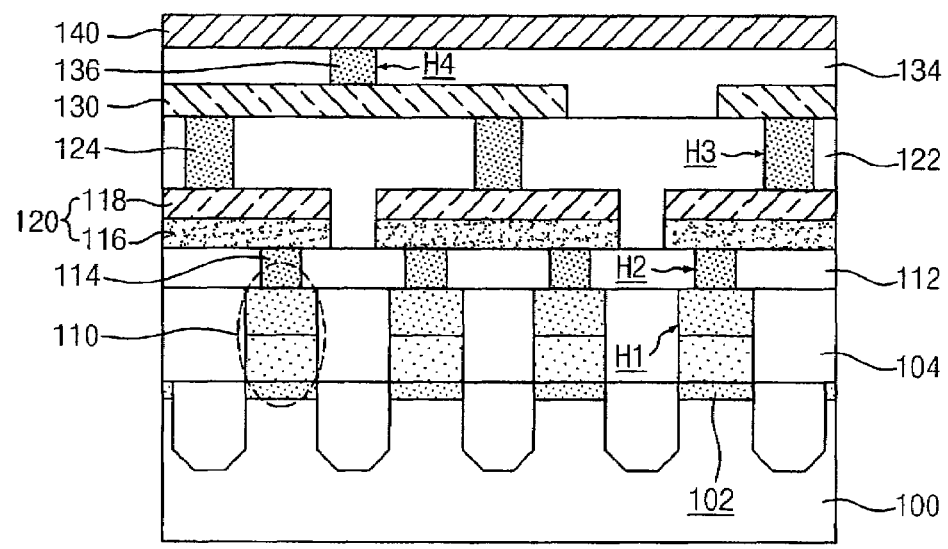

Referring to FIGS. 3F, 4F and 5F, after depositing a conductive metal layer on the fourth insulation layer 134 including the second top electrode contacts 136, and selectively patterning these conductive metal layer, bit lines 140 are formed. The bit lines 140 extend along the second direction Y and come into operational contact with the second top electrode contacts 136 arranged in the second direction Y. The bit lines 140 may have a width W4 of 20~200 nm.

The bit lines 140 and the top electrodes 118 are connected to each other by way of the wiring patterns 130. As compared to the conventional art, the contact depth between the bit lines 140 and the top electrodes 118 can be substantially reduced.

Figure 3G:
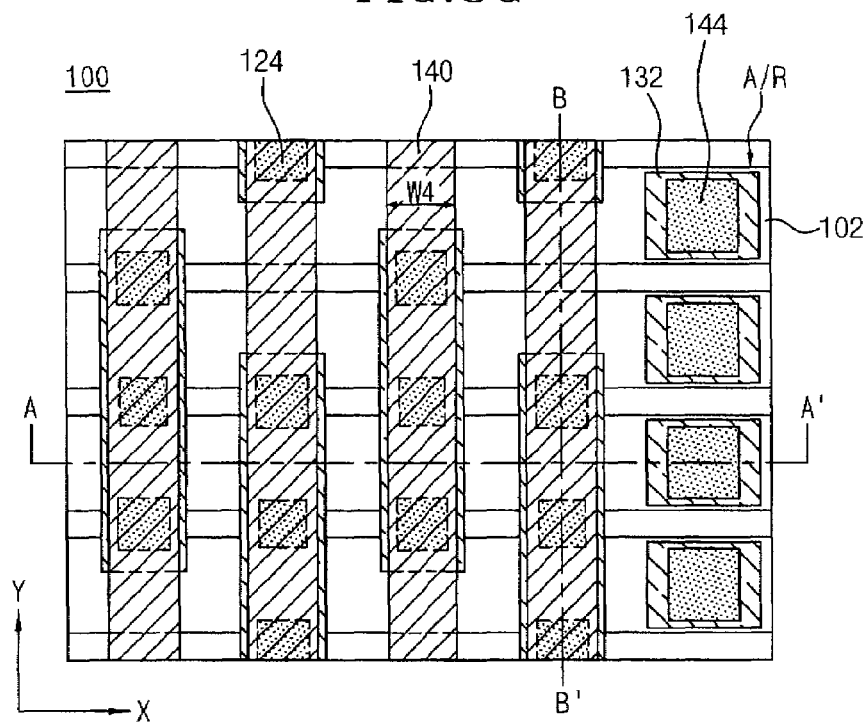
Figure 4G:
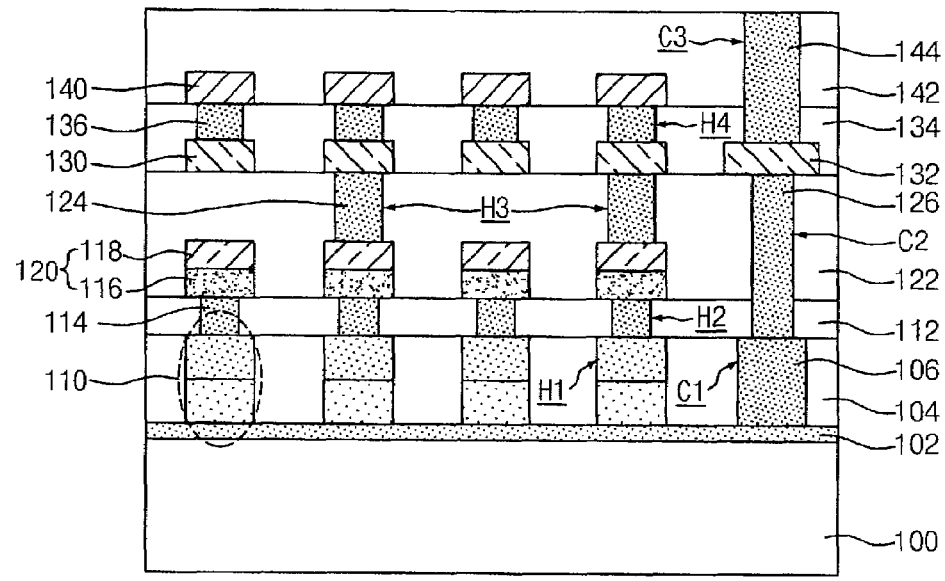
Figure 5G:
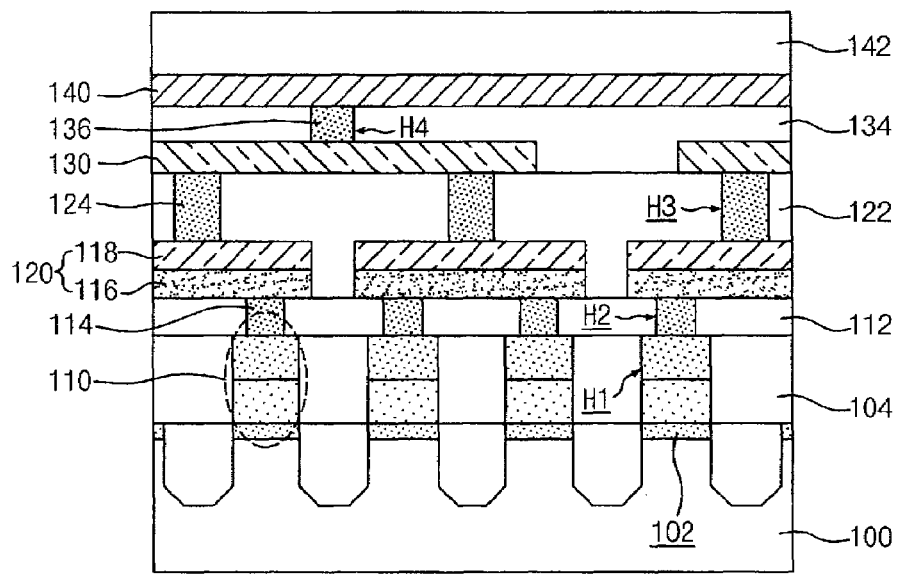

Referring to FIGS. 3G, 4G and 5G, a fifth insulation layer 142 is formed on the fourth insulation layer 134 including the bit lines 140. After defining third contact holes C3 by selectively etching the fifth insulation layer 142 and the fourth insulation layer 134 so that the buffer patterns 132 are exposed, and by filling a conductive layer in these third contact holes C3, a plurality of third contact plugs 144 is formed to come into contact with the buffer patterns 132.

Figure 3H:
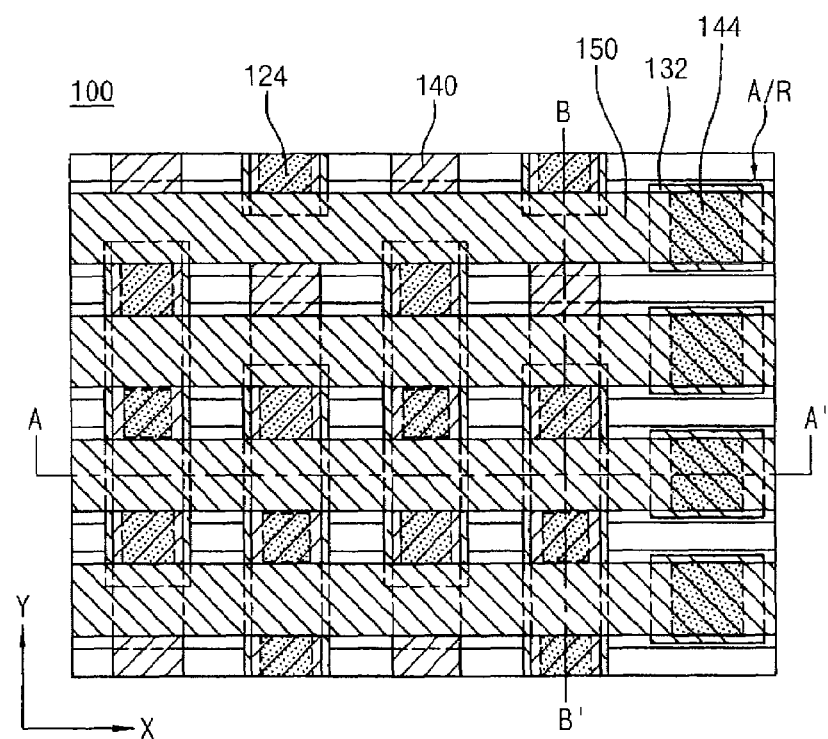
Figure 4H:
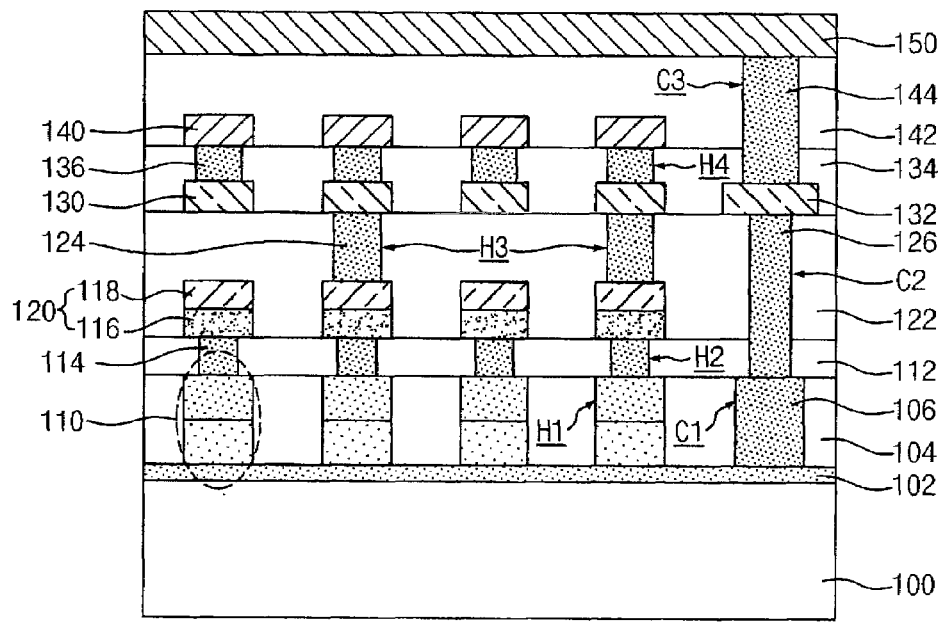
Figure 5H:
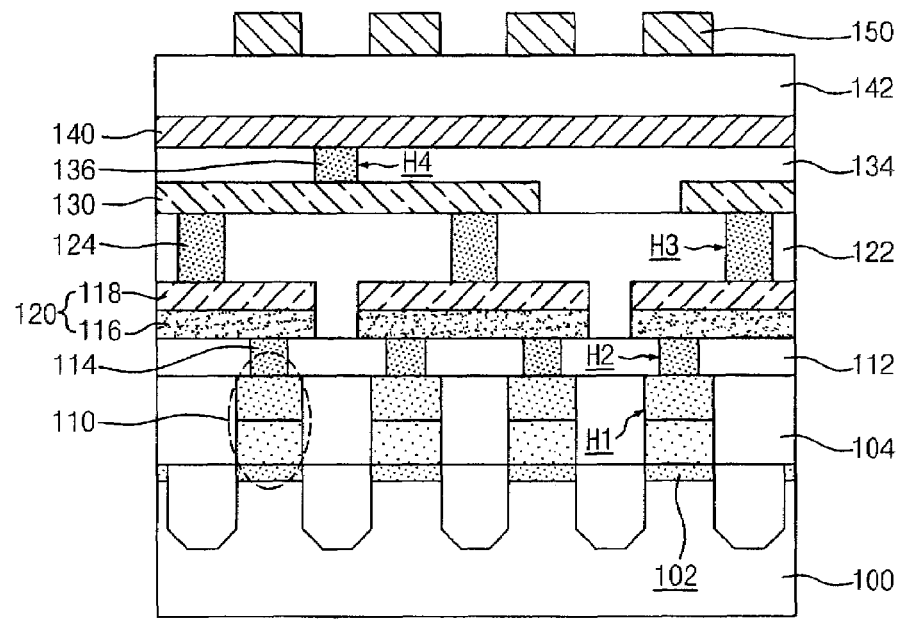

Referring to FIGS. 3H, 4H and 5H, a conductive layer, for use in defining word lines, is deposited on the fifth insulation layer 142 including the third contact plugs 144. By patterning the conductive layer, word lines 150 are then formed so that they extend along the first direction X which is substantially perpendicular to the second direction Y. Accordingly, the bit lines 140 are formed and are arranged at substantially regular intervals along the second direction Y, and come into contact with the third contact plugs 144 arranged in the first direction X. Accordingly, the word lines 150 are connected with the N+ base layer 102 of the silicon substrate 100 by way of the first contact plugs 106, the second contact plugs 126, the buffer patterns 132 and the third contact plugs 144.

Thereafter, while not shown in the drawings, by sequentially conducting a series of subsequent well-known processes, the manufacture of the phase change memory device according to the present embodiment is completed.

As described above, in the present embodiment, the stack patterns of the phase change layer and the top electrodes are formed to have a relatively short length that extends over only two cells. Accordingly, collapse of the stack patterns can be avoided or prevented. Further, any subsequent alteration of the composition of the phase change layer can be avoided or prevented associated with etch losses of the phase change layer. Since the contact depth between the top electrodes and the bit lines can be substantially reduced, the resultant stability of the contact process can be enhanced. As a consequence, the reliability of the phase change memory device and the manufacturing yield thereof can be improved and increased.

FIGS. 6A through 6D are plan views illustrating the processes of a method for manufacturing a phase change memory device in accordance with still yet another embodiment of the present invention. Here, the method according to this embodiment is the substantially same as the aforementioned embodiment up to the step of forming the stack patterns of a phase change and top electrodes. Therefore, only the steps after forming the stack patterns will be illustrated and described herein. The same reference numerals will be used to refer to the same parts as those illustrated in FIGS. 3A through 3H.

Figure 6A:
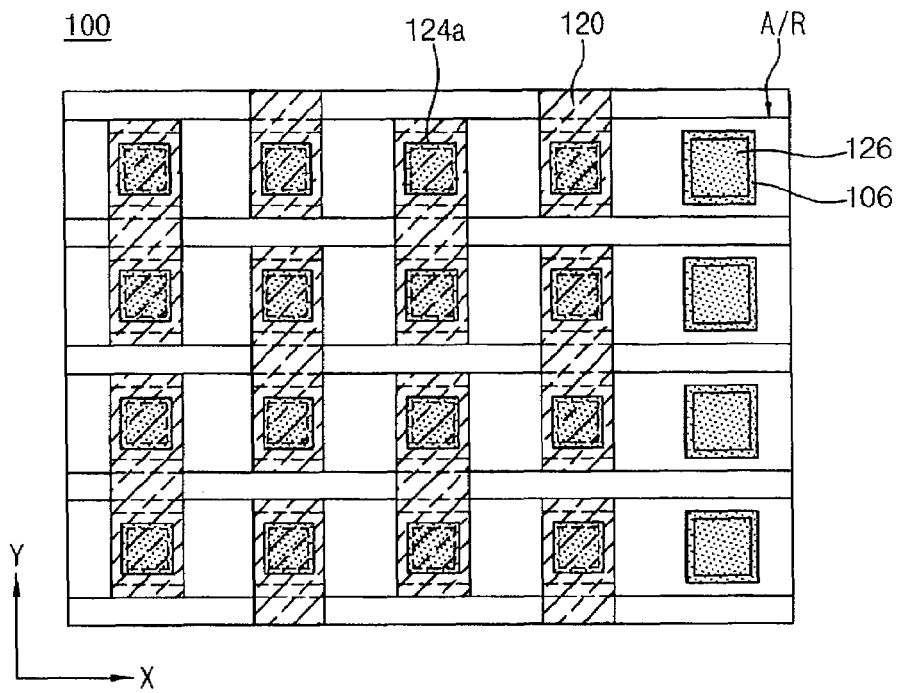
FIGS. 6A through 6D are plan views illustrating the processes of a method for manufacturing a phase change memory device in accordance with still another embodiment of the present invention.

Referring to FIG. 6A, a third insulation layer is formed on the resultant structure which is formed with the stack patterns 120 of a phase change layer and top electrodes. Then, after defining third holes for exposing the stack patterns 120 and second contact holes for exposing first contact plugs by selectively etching the third insulation layer, and by filling a conductive layer in the third holes and the second contact holes, a plurality of first top electrode contacts 124a are formed. The first top electrode contacts 124a are formed to come into contact with the top electrodes of the stack patterns 120. The second contact plugs 126 are formed to come into contact with the first contact plugs.

The first top electrode contacts 124a are formed so that each first top electrode contacts 124a is located over a respective heater. This is unlike the aforementioned embodiment in which each first top electrode contact is formed on the center portion of each stack pattern with respect to the second direction Y. The size of the first top electrode contacts 124a and the gap between the edge of the top electrode and the edge of each first top electrode contact 124a are substantially equivalent or equal to those of the aforementioned embodiment.

Figure 6B:
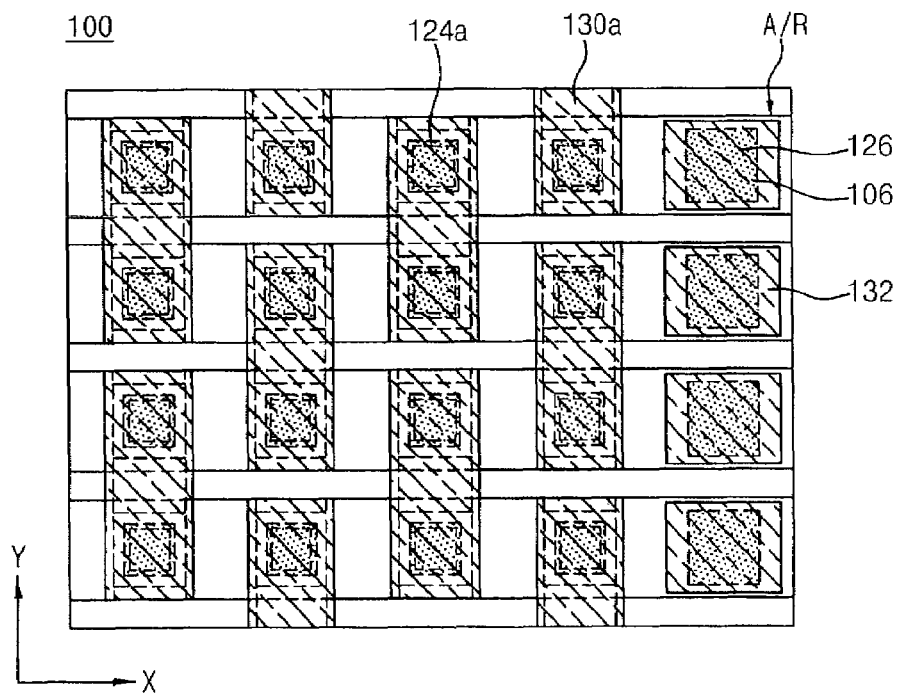

Referring to FIG. 6B, a conductive layer comprising a metallic layer is formed on the third insulation layer including the first top electrode contacts 124a and the second contact plugs 126. Then, by selectively patterning the conductive layer, a plurality of wiring patterns 130a are formed over the stack patterns 120 so that wiring pattern 130a is in operative contact with two first top electrode contacts 124a positione over each stack pattern 120. The buffer patterns 132 are formed on the second contact plugs 126.

Unlike the aforementioned embodiment in which the wiring patterns connect the stack patterns 120 of the phase change layer and the top electrodes in the structure of a chain, the wiring patterns 130a of this embodiment are formed to be simply located over the respective stack patterns 120. The width of the wiring patterns 130a in the first direction X, the length of the wiring patterns 130a in the second direction Y, and the separation distance of the wiring patterns 130a are made substantially equal to those of the aforementioned embodiment.

Figure 6C:
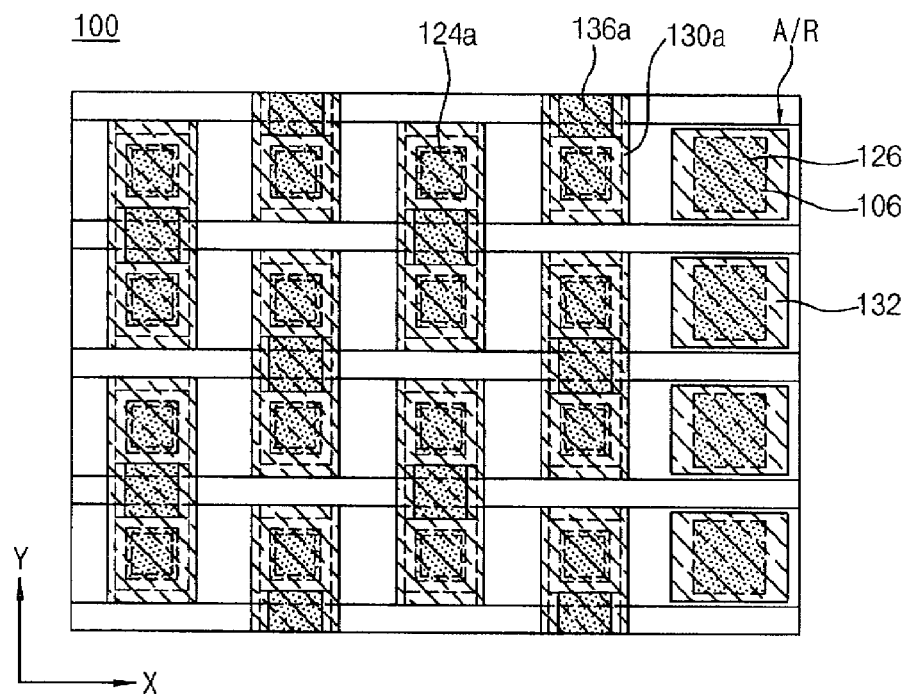

Referring to FIG. 6C, a fourth insulation layer is formed on the third insulation layer which is formed with the wiring patterns 130a and the buffer patterns 132. Then, after selectively defining fourth holes for use in exposing the center portions of the wiring patterns 130a in the second direction Y by selectively etching the fourth insulation layer, and by filling a conductive layer in these fourth holes, a plurality of second top electrode contacts 136a are formed.

Unlike the aforementioned embodiment in which each second top electrode contact is formed on the center portion of each wiring pattern such that it is positioned between two stack patterns when viewed in the second direction Y, each second top electrode contact 136a according to the present embodiment is formed on the center portion of each wiring pattern so that it is positioned centrally over each stack pattern 120 with respect to the second direction Y. The second top electrode contacts 136a that are formed have substantially the same size as the aforementioned embodiment.

Figure 6D:
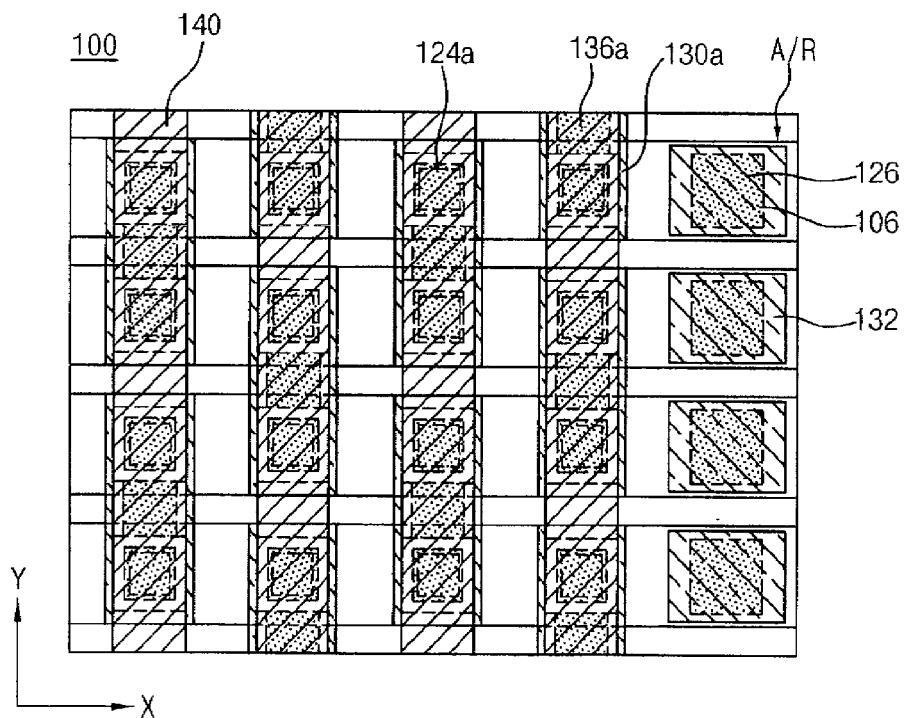

Referring to FIG. 6D, after depositing a conductive layer for bit lines on the fourth insulation layer including the second top electrode contact 136a, by selectively patterning the conductive layer, bit lines 140 are formed. The bit lines 140 extend along the second direction Y and come into operational contact with the second top electrode contacts 136a arranged in the second direction Y. The bit lines 140 have a width of 20~200 nm.

Thereafter, while not shown in the drawings, by sequentially conducting a series of subsequent well-known processes including processes for forming third contact plugs and word lines, the manufacture of the phase change memory device according to the present embodiment is completed.

Even in the phase change memory device according to the present embodiment, since the stack patterns of the phase change layer and the top electrodes are formed to have a length that only extends over two underlying memory cells, collapse of the stack patterns can be minimized or prevented. Also, by shortening the length of the stack pattern, it is possible to minimize or to prevent the composition of the phase change layer from being changed brought about by etch loss of the phase change layer. As a result, the reliability and the manufacturing yield of a phase change memory device can be substantially improved and increased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a phase change memory device, comprising the steps of:
    forming a plurality of stack patterns on a silicon substrate, each stack pattern comprising a phase change layer and a top electrode; and
    forming a plurality of bit lines over the stack patterns, wherein each stack pattern has a length that only extends over two memory cells of the device along a substantially parallel direction relative to the bit lines,
    wherein the second top electrode contacts are located on center portions of the wiring patterns with respect to the direction of the bit lines.

2. The method according to claim 1, wherein the stack patterns are formed in a zigzag pattern in a direction substantially perpendicular to the direction of the bit lines.

3. The method according to claim 1, further comprising the step of:
    forming a plurality of stack of first top electrode contacts, a plurality of wiring patterns and a plurality of second top electrode contacts between the stack patterns and the bit lines.

4. The method according to claim 3, wherein the wiring patterns are formed to be connected to the stack patterns by way of the first top electrode contacts.

5. The method according to claim 3, wherein the first top electrode contacts are formed on the stack patterns such that the first top electrode contacts are located on both sides of the stack patterns.

6. The method according to claim 3, wherein the wiring patterns are located over the stack patterns.

7. A method for manufacturing a phase change memory device, comprising the steps of:
    preparing a silicon substrate having a plurality of active regions that extend along a first direction and which are arranged at substantially regular intervals along a second direction, wherein the second direction is substantially perpendicular to the first direction;
    forming a plurality of switching elements in the active regions of the silicon substrate;
    forming a plurality of heaters on the switching elements;
    forming a plurality of stack patterns, each stack pattern comprising a phase change layer and a top electrode, wherein each stack pattern has a length that extends along the second direction and over two underlying heaters;
    forming a plurality of first top electrode contacts on the stack patterns;
    forming a plurality of wiring patterns, each wiring pattern coming into contact with two underlying first top electrode contacts, each wiring pattern extending along the second direction;
    forming a plurality of second top electrode contacts on the wiring patterns;
    forming a plurality of bit lines to be connected with the second top electrode contacts, each bit line extending along the second direction; and
    forming a plurality of word lines formed over the active regions of the silicon substrate, the word lines being positioned over the bit lines and extending along the first direction so that the word lines are substantially perpendicular to the bit lines.

8. The method according to claim 7, wherein the switching elements are formed as vertical PN diodes.

9. The method according to claim 8, further comprises the step of:
    forming an N+ base layer in surfaces of the active regions of the silicon substrate before the step of forming the vertical PN diodes.

10. The method according to claim 7, wherein the stack patterns are formed in a zigzag pattern along the first direction.

11. The method according to claim 7, wherein the stack patterns are formed to have a width of 10 nm-200 nm in the first direction and a length of 50 nm-500 nm in the second direction.

12. The method according to claim 7, wherein the stack patterns are formed to have a separation distance of 20 nm-200 nm in the first direction and a separation distance of 20 nm-200 nm in the second direction.

13. The method according to claim 7, wherein the first top electrode contacts are formed to have a size of 20 nm-200 nm in each of the first direction and the second direction.

14. The method according to claim 7, wherein the first top electrode contacts are formed to have sizes that are different in the first direction and the second direction.

15. The method according to claim 7, wherein the first top electrode contacts are formed to have a gap of 0 nm-100 nm between an edge of the top electrode and an edge of an overlying respective first top electrode contact.

16. The method according to claim 7, wherein the wiring patterns are formed to be connected to the stack patterns by way of the respective first top electrode contacts.

17. The method according to claim 7, wherein the wiring patterns are formed to have a width of 20 nm-200 nm in the first direction and a length of 50 nm-1,000 nm in the second direction.

18. The method according to claim 7, wherein the wiring patterns are formed to have a separation distance of 10 nm-100 nm in the first direction.

19. The method according to claim 7, wherein the second top electrode contacts are formed to be located on center portions of the wiring patterns in the second direction.

20. The method according to claim 7, wherein the second top electrode contacts are formed to have a size of 20 nm-200 nm in each of the first direction and the second direction.

21. The method according to claim 7, wherein the second top electrode contacts have sizes that are different in the first direction and the second direction.

22. The method according to claim 7, wherein each bit line has a width of 20 nm-200 nm.

* * * * *